United States Patent
Yamada et al.

(12)

(10) Patent No.: US 6,384,620 B1
(45) Date of Patent: May 7, 2002

(54) SIGNAL DECIDING APPARATUS

(75) Inventors: Hiroyuki Yamada, Kanagawa; Kazuo Suto; Hidehisa Murayama, both of Tokyo, all of (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/748,852

(22) Filed: Dec. 28, 2000

(30) Foreign Application Priority Data

Jul. 26, 2000 (JP) ........................................ 2000-224923

(51) Int. Cl.[7] .............................................. H03K 17/16
(52) U.S. Cl. ........................... 326/29; 326/83; 327/184; 330/9
(58) Field of Search ............................. 326/29, 82, 83, 326/86; 327/184, 363, 543; 330/9, 82, 85, 259, 270, 290

(56) References Cited

U.S. PATENT DOCUMENTS 3,707,685 A  * 12/1972  Geffe ........................... 330/21
4,524,327 A  * 6/1985  Masuda et al. ............. 330/253

* cited by examiner

*Primary Examiner*—Michael Tokar
*Assistant Examiner*—Daniel D. Chang
(74) *Attorney, Agent, or Firm*—Venable; Robert J. Frank

(57) ABSTRACT

A signal deciding apparatus which can obtain a stable digital signal OUT irrespective of an amplitude and a duty ratio of an input signal IN is provided. The input signal IN is amplified by inverters ($5_1$ to $5_3$ and 8) and outputted as a digital signal OUT. A signal (S5) on the input side of the inverter (8) is integrated by a time constant which is equal to a data period of the input signal IN by an integrator (9) and supplied to a differential amplifier (20). A signal (S8) on the output side of the inverter (8) is integrated by a large time constant by an integrator (10), a control voltage VC supplied from a control terminal (13) is multiplexed to the integrated signal S8, and a resultant signal is sent to the differential amplifier (20). An output signal of the differential amplifier (20) is integrated by a resistor (11) and a capacitor (4) and its average level is fed back as a threshold voltage to the input side of the inverter ($5_1$) through a resistor (3) and multiplexed to the input signal IN. Thus, the digital signal OUT based on the duty ratio of the input signal IN is obtained.

8 Claims, 3 Drawing Sheets

SIGNAL DECIDING APPARATUS

BACKGROUND OF THE INVENTION

1. Field of the Invention

The invention relates to a signal deciding apparatus suitable for use in a semiconductor integrated circuit and, more particularly, to a signal deciding apparatus for converting an AC signal component into a binary digital signal corresponding to the logic levels "0" and "1".

2. Related Background Art

FIG. 2 is a circuit diagram showing an example of a conventional signal deciding apparatus.

The signal deciding apparatus has: an input terminal 1 to which an input signal IN is inputted from an outside; and a control terminal 2 to which a control voltage VC for setting a threshold voltage is supplied. Those terminals are connected by a terminating resistor 3 (for example, 50Ω). A capacitor 4 (for example, 0.1 $\mu$F) for connecting the control terminal 2 to the ground in an AC manner is connected between the control terminal 2 and a grounding voltage GND.

Three cascade connected inverters $5_1$, $5_2$, and $5_3$ are connected to the input terminal 1. An output side of the inverter $5_3$ at the final stage is connected to an output terminal 6. Further, a feedback resistor 7 (for example, 400Ω) is connected between the output terminal 6 and control terminal 2. A digital signal OUT corresponding to a desired logic level is outputted from the output terminal 6.

In such an input circuit, when the input signal IN is inputted to the input terminal 1 through a capacitor (not shown), the input signal IN is terminated by the resistor 3 and capacitor 4. Its voltage is inversion amplified by the inverters $5_1$ to $5_3$ of three stages and outputted as a digital signal OUT from the output terminal 6. An average value of the output voltage of the inverter $5_3$ is fed back to the input side of the inverter $5_1$ through an integrating circuit comprising the resistor 7 and capacitor 4 and through the terminating resistor 3.

Thus, if a spread of a noise distribution at the H (high) level of the input signal IN and that of a noise distribution at the L (low) level are almost equal, a duty ratio of the input signal IN is equal to 50% and a threshold value of the signal deciding apparatus can be set to a center voltage as a voltage average value of the input signal IN. Therefore, the preferable output digital signal OUT can be obtained by the signal deciding apparatus. When a deviation occurs between the spread of the noise distribution at the H level of the input signal IN and that of the noise distribution at the L level, the threshold value of the signal deciding apparatus is deviated from the center voltage of the input signal IN, so that it is difficult to accurately decide the H or L level.

In the conventional signal deciding apparatus, therefore, by applying the control voltage VC to the control terminal 2, the threshold value of the signal deciding apparatus can be adjusted in accordance with a change in duty ratio of the input signal IN.

In the conventional signal deciding apparatus, however, the control voltage VC for adjustment of the threshold value is applied as a bias of the input signal IN to the inverter $5_1$ at the front stage through the terminating resistor 7.

Therefore, when the voltage level of the input signal IN decreases, the micro control voltage VC corresponding to the reduction of the voltage level is necessary and the proper threshold value adjustment cannot be easily made.

In case of setting a threshold voltage according to the duty ratio of the input signal IN by applying the control voltage VC to the control terminal 2, if a level of a signal smaller than a discriminatable amplitude of the inverter $5_1$ is inputted as an input signal IN, a duty ratio of the digital signal OUT on the output side largely changes due to such a delicate change of the threshold voltage and there is a problem such that it is difficult to perform a stable control.

SUMMARY OF THE INVENTION

It is, therefore, an object of the invention to solve the problems of the conventional technique and to provide an input circuit which can obtain a stable digital signal OUT irrespective of an amplitude and a duty ratio of an input signal IN.

According to a first preferred aspect of the invention, there is provided a signal deciding apparatus comprising: an amplifying circuit which has a plurality of inverting amplifiers that are mutually serially connected and is used for converting an AC input signal into a binary digital signal; and a feedback path which is used for feeding back an output signal of the amplifying circuit to an input signal thereof in order to set a threshold value for binary decision of the amplifying circuit and is equipped with a first integrating circuit for prevention of an oscillation that is caused due to the feedback signal, wherein the feedback path has: a second integrating circuit for integrating an output signal of one of the inverting amplifiers locating at an odd number stage when it is seen from an input side of the amplifying circuit by a predetermined time constant; a third integrating circuit for integrating an output signal of one of the inverting amplifiers locating at an even number stage when it is seen from the input side of the amplifying circuit by a time constant larger than the time constant of the second integrating circuit; a comparing circuit for comparing output voltages of both of those integrating circuits and supplying an output voltage to the first integrating circuit; and a control circuit for applying a control voltage for setting a threshold voltage to an input terminal of the comparing circuit for receiving the output voltage of the third integrating circuit.

According to a second aspect of the invention, the comparing circuit sets the sum of the output voltage of the third integrating circuit and the control voltage to a threshold value and, when the threshold value is larger than the output voltage of the second integrating circuit, the comparing circuit generates a low level signal to the first integrating circuit, and when the threshold value is smaller than the output voltage of the second integrating circuit, the comparing circuit generates a high level signal to the first integrating circuit.

According to a third aspect of the invention, the amplifying circuit has an even number of inverting amplifiers, the first integrating circuit integrates an input side signal of the inverting amplifier at the final stage, and the second integrating circuit integrates an output signal of the inverting amplifier at the final stage.

According to a fourth aspect of the invention, the first integrating circuit has a time constant which is almost equal to that of the third integrating circuit.

According to a fifth aspect of the invention, the time constant of the second integrating circuit is almost equal to a data period of the input signal.

According to a sixth aspect of the invention, the time constant of the third integrating circuit is hundreds to thousands of times as large as that of the second integrating circuit.

According to a seventh aspect of the invention, the comparing circuit comprises 2n+1 (n is a natural number)

operational amplifiers each of which is constructed by mutually serially connecting a depression type field effect transistor and an enhancement type field effect transistor, the 2n operational amplifiers are constructed by serially connecting them to n stages in a manner such that two operational amplifiers whose positive phase (+) sides and negative phase (−) sides are complementarily connected in parallel are used as one set, both outputs of one set of operational amplifiers constructing the set at the final stage of the n-stage connection are inputted to one (2n+1)th operational amplifier for the purpose of comparing them, and a comparison result is inpuutted as an output of the comparing circuit to the first integrating circuit.

According to an eighth aspect of the invention, the input side signal of the inverting amplifier at the final stage of the amplifying circuit is voltage divided into a certain ratio {a/(a+b)} and its voltage division value is inputted to the second integrating circuit. The output side signal of the inverting amplifier at the final stage of the amplifying circuit is voltage divided into a ratio {b/(a+b)} obtained by subtracting the above ratio from 1 and its voltage division value is inputted to the third integrating circuit.

The above and other objects and features of the present invention will become apparent from the following detailed description and the appended claims with reference to the accompanying drawings.

DETAILED DESCRIPTION OF THE PREFERRED EMBODIMENTS (First Embodiment)

Figure 1:
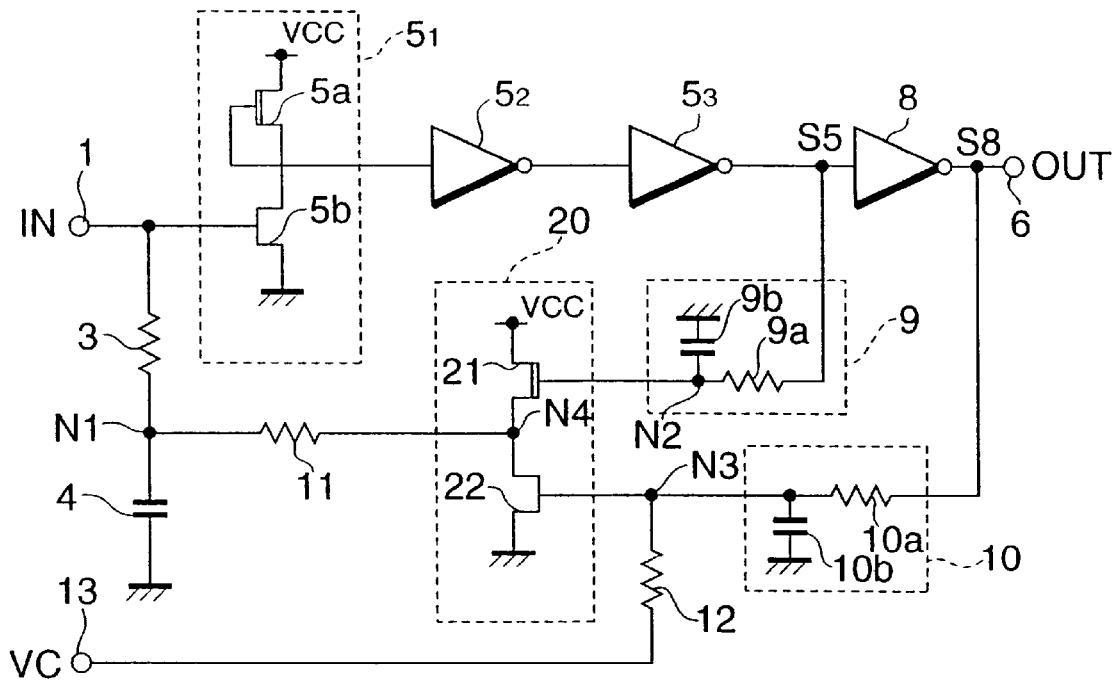
FIG. 1 is a circuit diagram showing the first embodiment of a signal deciding apparatus according to the invention.

FIG. 1 is a circuit diagram of a signal deciding apparatus showing the first embodiment of the invention. Component elements similar or common to those in FIG. 2 are designated by the same reference numerals.

Figure 2:
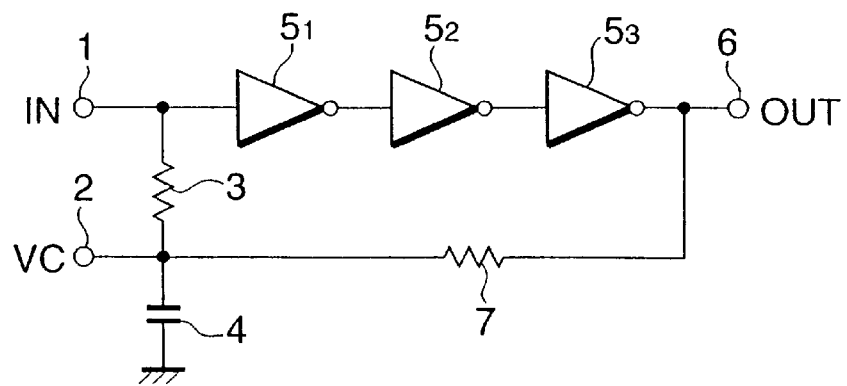
FIG. 2 is a circuit diagram showing a conventional signal deciding apparatus.

In a manner similar to FIG. 2, the signal deciding apparatus has the input terminal 1 to which the input signal IN is inputted from the outside. One end of the terminating resistor 3 (for example, 50Ω) is connected to the input terminal 1 and the other end of the resistor 3 is connected to a node N1. The node N1 is connected to the grounding voltage GND in an AC manner through the capacitor 4 (for example, 0.1 μF). The capacitor 4 constructs a first integrating circuit provided for a feedback circuit to the input terminal 1 from an amplifying circuit, which will be explained hereinlater, together with a resistor 11.

Further, amplifying means comprising four inverting amplifiers (for example, inverters) $5_1$, $5_2$, $5_3$, and 8 which are cascade connected, namely, an amplifying circuit is connected to the input terminal 1. An output side of the inverter 8 at the final stage is connected to the output terminal 6.

Each of the inverters $5_1$ to $5_3$ and 8 has the same construction. For example, as shown in the inverter $5_1$, it is a DCFL (direct coupled FET logic) comprising a D-FET 5a made by a GaAs-MESFET (metal semiconductor FET) and an E-FET 5b. The D-FET 5a is a transistor for a load. A drain of the D-FET 5a is connected to a power voltage VCC and its gate and source are connected to a drain of the E-FET 5b. The E-FET 5b is a transistor for switching. A source of the E-FET 5b is connected to the grounding voltage GND, the input signal is supplied to a gate, and an inverted output signal is generated from the drain.

A second integrating circuit comprising an integrator 9 is connected to an output side of the inverter $5_3$. The integrator 9 comprises a resistor 9a (for example, 1 kΩ) and a capacitor 9b (for example, 0.1 pF). The output side of the inverter $5_3$ is connected to one end of the resistor 9a. The other end of the resistor 9a is connected to a node N2. The capacitor 9b is connected between the node N2 and the grounding voltage GND. A time constant of the integrator 9 is set to a value which is almost equivalent to a data period (for example, the data period is equal to 0.1 nsec in case of a data rate of 10 G/sec) of the input signal IN.

A third integrating circuit 10 comprising an integrator is connected to an output side of the inverter 8. The integrator 10 comprises a resistor 10a (for example, 10 kΩ) and a capacitor 10b (for example, 10 pF). The output side of the inverter 8 is connected to one end of the resistor 10a. The other end of the resistor 10a is connected to a node N3. The capacitor 10b is connected between the node N3 and the grounding voltage GND. A time constant of the integrator 10 is set to a value which is hundreds to thousands of times as large as the data period of the input signal IN.

An input side of a comparing circuit 20 serving as comparing means comprising, for example, a differential amplifier is connected to the nodes N2 and N3. The differential amplifier 20 is formed by serially connecting a D-FET 21 and an E-FET 22. A drain of the D-FET 21 is connected to the power voltage VCC and a gate is connected to the node N2. A source of the D-FET 21 is connected to a node N4 on the output side, namely, a drain of the E-FET 22. A gate of the E-FET 22 is connected to the node N2. A source of the E-FET 22 is connected to the grounding voltage GND. The node N4 is connected to the node N1 through the resistor 11 of a feedback circuit comprising the resistors 11 and 3 and capacitor 4. The first integrating circuit is constructed by the resistor 11 and capacitor 4. A time constant of the first integrating circuit is almost equal to that of the third integrating circuit.

The node N3 is connected to a control terminal 13 of a control circuit through a resistor 12 (for example, 10 kΩ). The control terminal 13 is used for applying a control voltage VC for controlling a threshold voltage.

Figure 3:
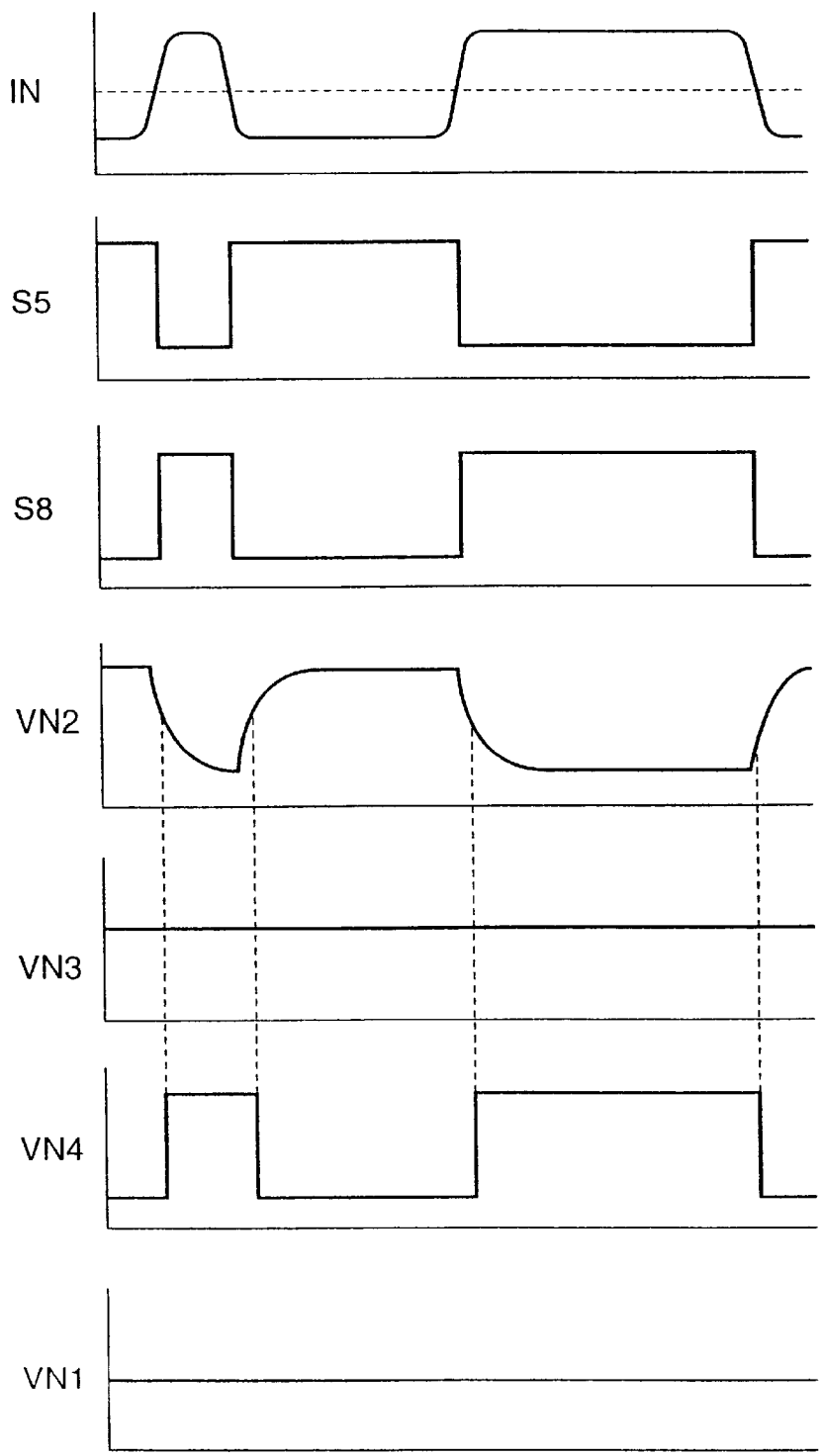
FIG. 3 is a signal waveform diagram showing the operation of the signal deciding apparatus shown in FIG. 1.

FIG. 3 is a signal waveform diagram showing the operation of the signal deciding apparatus according to the invention shown in FIG. 1. The operation of the signal deciding apparatus of FIG. 1 will now be described hereinbelow with reference to FIG. 3.

In the signal deciding apparatus, when the input signal IN is inputted to the input terminal 1 through a capacitor (not shown) called an AC coupling capacitor, the input signal IN is terminated by the resistor 3 and capacitor 4 and its voltage is inversion amplified by the inverters $5_1$ to $5_3$ of three stages. A signal S5 is outputted from the output side of the inverter $5_3$ at the odd number stage. The signal S5 is further inverted by the inverter 8 at the even number stage. A signal S8 is outputted as a digital signal OUT from the output terminal 6.

The signal S5 is integrated by the second integrator 9. A voltage VN2 as shown in FIG. 3 which was integrated by a time constant similar to that of the input signal IN is obtained at the node N2. The signal S8 is integrated by the integrator 10 and a voltage VN3 integrated by a large time constant is obtained at the node N3.

The voltages VN2 and VN3 are supplied to the differential amplifier 20. A voltage VN4 corresponding to a comparison result of the voltages VN2 and VN3 is outputted to the node N4 on an output side of the differential amplifier 20. The voltage VN4 is further integrated by the first integrating circuit comprising the resistor 11 and capacitor 4. A voltage VN1 which is proportional to the usual duty ratio of the input signal IN is derived at the node N1 so long as the control voltage VC is not applied to the control terminal 13. The voltage VN1 is fed back as a logical threshold value to the input side of the inverter 5₁ through the resistor 3.

That is, the time constant of the third integrating circuit 10 is set to a sufficiently large value which is necessary for obtaining an average value of the output voltage value of the amplifying circuit ($5_1$ to $5_3$ and 8) as mentioned above. The comparing circuit sets the output voltage value obtained from the second integrating circuit to a reference voltage and compares the output voltage value derived from the third integrating circuit 10. Further, when the control voltage VC is not applied, the reference voltage value coincides with the average voltage value when the duty ratio of the input signal IN is equal to 50%. Consequently, the comparator 20 sets the average voltage value outputted from the second integrating circuit 9 to a threshold value and decides a magnitude of the output voltage value obtained from the third integrating circuit 10. A comparison result is fed back to the inverter $5_1$ at the first stage through the first integrating circuit similar to that in the conventional apparatus.

Thus, when the duty ratio of the input signal IN is equal to 50%, the voltage VN1 at the node N1 coincides with the center voltage of the input signal IN and a duty ratio of the digital signal OUT is also equal to 50%. The digital signal OUT whose level coincides with the internal logic level is outputted from the output terminal 6 by the amplifying function of the inverters $5_1$ to $5_3$ and 8 of four stages.

On the other hand, in case of setting the threshold voltage according to the duty ratio of the input signal IN, by applying the control voltage VC to the control terminal 13, the voltage VN3 at the node N3 is controlled and the logical threshold value which is supplied to the input side of the inverter $5_1$ is controlled.

The control voltage VC for adjustment of the threshold voltage according to the duty ratio is not applied to the input terminal of the inverter $5_1$ at the front stage as a bias of the input signal IN as in the conventional apparatus but used as a reference voltage of the comparing circuit 20 and additionally applied to the output voltage value of the inverter 8 having the amplifying function. Therefore, the more accurate and stable control as compared with the conventional one can be performed and the correct digital signal OUT can be obtained irrespective of the magnitude of the amplitude and the duty ratio of the input signal IN.

As mentioned above, the input circuit of the first embodiment comprises: the integrator 9 for amplifying the input signal IN and, thereafter, integrating it by the time constant similar to the period of the input signal IN; the integrator 10 for integrating the input signal IN by the large time constant; and the differential amplifier 20 for comparing the output signals of the integrators 9 and 10 and feeding back the average value corresponding to the comparison result as a threshold voltage to the input side. The terminal 13 for controlling the threshold voltage is connected to the output side of the integrator 9 through the resistor 12. Thus, since the voltages VN2 and VN3 which are integrated by the integrators 9 and 10 and change gently are compared by the differential amplifier 20 and the threshold voltage can be obtained, even if the signal whose amplitude is smaller than the discriminatable amplitude of the inverter $5_1$ is inputted as an input signal IN, the control voltage VC can accurately set the threshold voltage in a wide control range. The duty ratio of the digital signal OUT can be stably controller.

(Modification)

Figure 4:
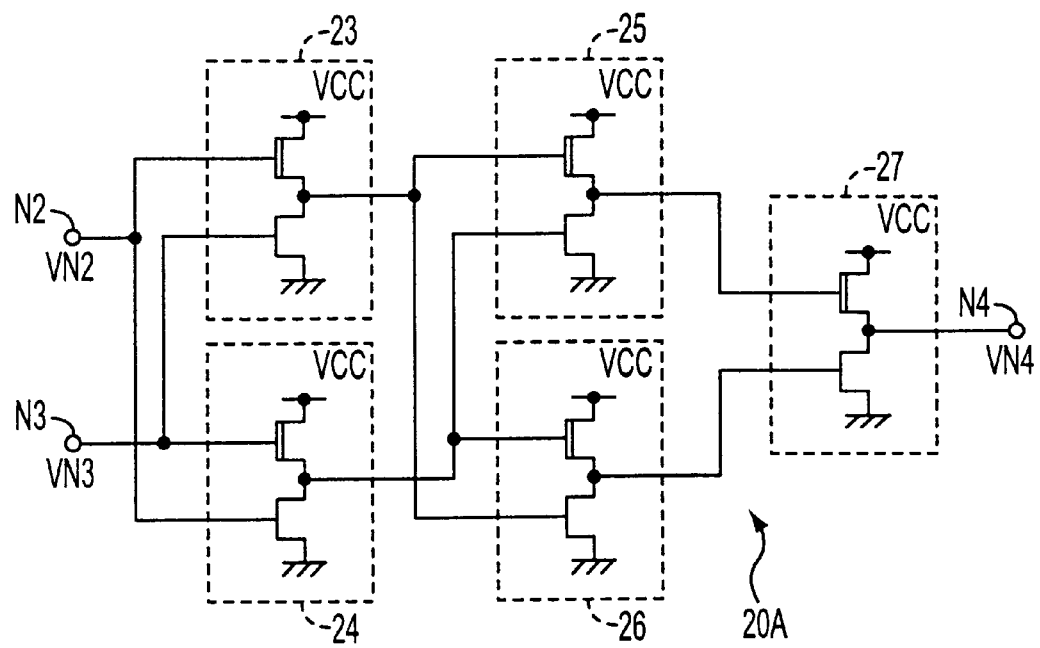
FIG. 4 is a circuit diagram of a differential amplifier showing a modification of a comparing circuit according to the invention.

FIG. 4 is a circuit diagram showing a modification of the comparing circuit 20 of the invention.

A differential amplifier 20A is provided in place of the differential amplifier 20 in FIG. 1 and comprises DCFL inverters 23, 24, 25, 26, and 27 serving as GaAs-MESFETs. Each of the inverters 23 to 27 has a construction similar to that of the differential amplifier 20 in FIG. 1 and has a double-phase input inverter construction in which a D-FET and an E-FET are serially connected between the power voltage VCC and grounding voltage GND.

Gates of the D-FET and E-FET of the inverter 23 are connected to the nodes N2 and N3 and gates of the D-FET and E-FET of the inverter 24 are connected to the nodes N3 and N2, respectively. An output side of the inverter 23 is connected to a gate of the D-FET of the inverter 25 and to a gate of the E-FET of the inverter 26, respectively. An output side of the inverter 24 is connected to a gate of the E-FET of the inverter 25 and to a gate of the D-FET of the inverter 26, respectively. Further, output sides of the inverters 25 and 26 are connected to gates of the D-FET and the E-FET of the inverter 27, respectively. An output side of the inverter 27 corresponds to the node N4.

The operation of the differential amplifier 20A is fundamentally the same as that of the differential amplifier 20.

That is, when the voltage VN2 at the node N2 is higher than the voltage VN3 at the node N3, an output voltage of the inverter 23 is higher than the voltage VN2 and an output voltage of the inverter 24 is lower than the voltage VN3. Thus, a difference between the output voltages of the inverters 23 and 24 is larger than that of the voltages VN2 and VN3 on the input side. Further, the difference between the output voltages of the inverters 23 and 24 is amplified by the inverters 25 and 26 and sent to the inverter 27. The voltage VN4 as a comparison result is generated from the inverter 27 to the node N4.

As mentioned above, the differential amplifier in the second embodiment constructs the amplifying circuit of three stages by complementarily combining the five inverters 23 to 27 in parallel and cascade connecting them. Thus, the comparing operation can be performed within a wide range of the logic levels of "H" and "L" of the DCFL.

(Second Embodiment)

Figure 5:
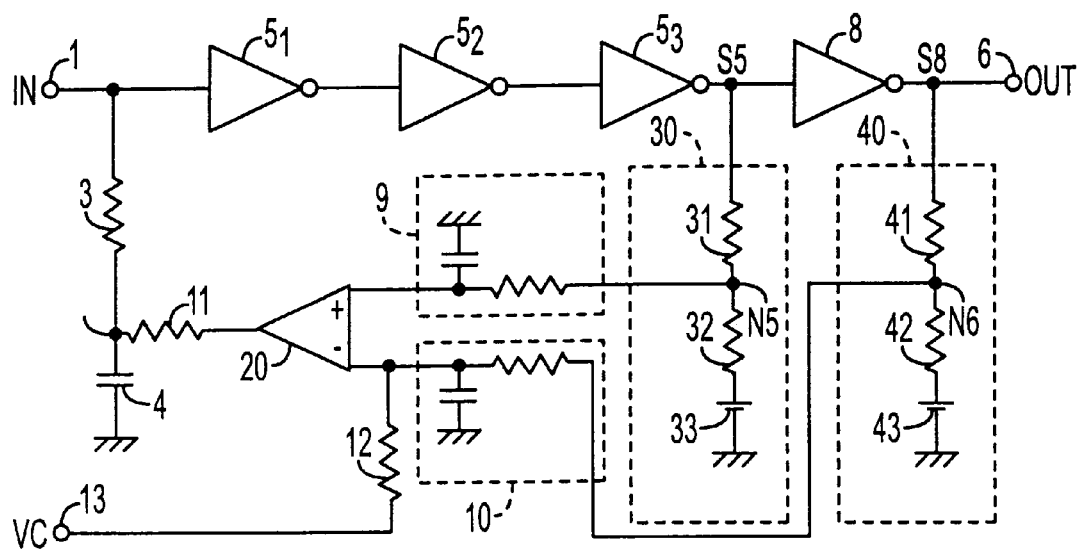
FIG. 5 is a circuit diagram showing the second embodiment of a signal deciding apparatus according to the invention.

FIG. 5 is a circuit diagram of a signal deciding apparatus showing the second embodiment of the invention. Component elements which are similar or common to those in FIG. 1 are designated by the same reference numerals.

In the signal deciding apparatus, a first voltage dividing circuit, namely, a setting unit 30 for setting a duty ratio is provided between the output side of the inverter $5_3$ and the integrator 9 in FIG. 1, and a second voltage dividing circuit, namely, a setting unit 40 similar to that mentioned above is provided between the output side of the inverter 8 and the integrator 10.

The setting unit 30 comprises: a resistor 31 having a resistance value R1; a resistor 32 having a resistance value R2; and a voltage source 33 set to the same voltage as an output voltage VL at the "L" level of the inverter $5_3$. One end of the resistor 31 is connected to the output side of the inverter $5_3$ and the other end is connected to a node N5. One end of the resistor 32 is connected to the node N5 and the other end is connected to the voltage source 33. The node N5 is connected to the input side of the integrator 9.

The setting unit 40 comprises: a resistor 41 having a resistance value R3; a resistor 42 having a resistance value R4; and a voltage source 43 set to the same voltage as the output voltage VL at the "L" level of the inverter 8. The resistance values R1 to R4 are set to values according to the duty ratio of the input signal IN so as to have a relation of (R1/R2=R4/R3). One end of the resistor 41 is connected to the output side of the inverter 8 and the other end is connected to a node N6. One end of the resistor 42 is connected to the node N6 and the other end is connected to the voltage source 43. The node N6 is connected to the input side of the integrator 10. The other construction is similar to that in FIG. 1.

The operation will now be described.

For example, it is assumed that the duty ratio of the input signal IN is equal to 25%. Since the signal S5 on the output side of the inverter $5_3$ is obtained by inverting the input signal IN, a duty ratio of the signal S5 is equal to 75%. A duty ratio of the signal S8 on the output side of the inverter 8 is equal to 25%.

Now, assuming that R1=R4=750Ω and R2=R3=250Ω, the divided voltages based on the voltage division ratios obtained from the voltages in which the voltage that is $[R1 \times R2/(R1+R2)^2]$ times as large as the logical amplitude is added to the output voltages VL at the "L" level of the inverters $5_3$ and 8 are inputted to two input terminals of the differential amplifier 20. Thus, the threshold value of the deciding apparatus can be properly set in a manner such that the output signal having the duty ratio of 25% can be obtained as an output signal of the signal deciding apparatus. Further, a fine adjustment can be performed by the adjustment of the control voltage VC.

As mentioned above, since the input circuit of the second embodiment has the setting units 30 and 40 for setting the duty ratio so that it can be changed in a wide range, by setting the resistance values R1 to R4 of the resistors in the setting units 30 and 40 in accordance with the duty ratio of the input signal IN and, further, by adjusting the control voltage VC, the threshold voltage for separating the input signal IN into the "H" level and the "L" level can be precisely set.

The invention is not limited to the above embodiments but many modifications and variations are possible. As modifications, for example, there are the following examples.

(a) Although the inverters $5_1$ to $5_3$ and 8 and the differential amplifiers 20 and 20A are constructed by the DCFLs using the GaAs-MESFETs, they can be also constructed by using N-channel MOS transistors or complementary MOS transistors.

(b) The number of inverters $5_1$ to $5_3$ is not limited to 3 but it is sufficient to use a plurality of number of inverters.

(c) The constructions of the differential amplifiers 20 and 20A are not limited to those shown in the diagrams. Any construction can be applied so long as it has a function similar to that mentioned above.

(d) It is also possible to connect the integrator 10 to the input side of the inverter 8 and to connect the integrator 9 to the output side.

According to the first invention as described in detail above, the feedback circuit for which the first integrating circuit is provided has: the second integrating circuit for integrating the amplified input signal by the predetermined time constant that is almost equal to the data period of the input signal; and the third integrating circuit for integrating the input signal by the large time constant. The feedback means for multiplexing the threshold voltage formed on the basis of the comparison result of the output voltages of the second and third integrating circuits and the control voltage which is used for control of the threshold voltage and applied from the control means to the input signal is constructed by those integrating circuits. Therefore, the stable digital signal can be obtained irrespective of the amplitude and duty ratio of the input signal.

By constructing the comparing circuit by connecting the double-stage input inverters of multistages each of which is constructed by serially connecting the D-FET and the E-FET, the comparing operation can be performed in the wide range of the logic level.

According to the second invention, the first and second voltage dividing means for voltage dividing the amplified input signal and applying it to the first and second integrating circuits are provided. Thus, the threshold voltage according to the duty ratio of the input signal can be precisely set.

Although the invention has been described above with respect to the preferred embodiments, the invention is not limited to the foregoing embodiments but many modifications and variations are possible within the spirit and scope of the appended claims of the invention.

What is claimed is:

1. A signal deciding apparatus comprising:
   an amplifying circuit which has a plurality of inverting amplifiers that are mutually serially connected and is used for converting an AC input signal into a binary digital signal; and
   a feedback path which is used for feeding back an output signal of said amplifying circuit to an input signal thereof in order to set a threshold value for binary decision of said amplifying circuit and is equipped with a first integrating circuit for prevention of an oscillation that is caused due to the feedback signal,
   wherein said feedback path has:
      a second integrating circuit for integrating an output signal of one of said inverting amplifiers locating at an odd number stage when it is seen from an input side of said amplifying circuit by a predetermined time constant;
      a third integrating circuit for integrating an output signal of one of said inverting amplifiers locating at an even number stage when it is seen from the input side of said amplifying circuit by a time constant larger than the time constant of said second integrating circuit;
      a comparing circuit for comparing output voltages of both of said integrating circuits and supplying an output voltage to said first integrating circuit; and
      a control circuit for applying a control voltage for setting a threshold voltage to an input terminal of said comparing circuit for receiving the output voltage of said third integrating circuit.

2. An apparatus according to claim 1, wherein said comparing circuit sets the sum of said output voltage of said third integrating circuit and said control voltage to a threshold value and, when said threshold value is larger than the output voltage of said second integrating circuit, said comparing circuit generates a low level signal to said first integrating circuit, and when said threshold value is smaller than the output voltage of said second integrating circuit, said comparing circuit generates a high level signal to said first integrating circuit.

3. An apparatus according to claim 1, wherein said amplifying circuit has an even number of inverting amplifiers, said first integrating circuit integrates an input side signal of said inverting amplifier at the final stage, and said second integrating circuit integrates an output signal of said inverting amplifier at said final stage.

4. An apparatus according to claim 1, wherein said first integrating circuit has a time constant which is almost equal to that of said third integrating circuit.

5. An apparatus according to claim 1, wherein the time constant of said second integrating circuit is almost equal to a data period of said input signal.

6. An apparatus according to claim 1, wherein the time constant of said third integrating circuit is hundreds to thousands of times as large as that of said second integrating circuit.

7. An apparatus according to claim 1, wherein said comparing circuit comprises 2n+1 (n is a natural number) operational amplifiers each of which is constructed by mutually serially connecting a depression type field effect transistor and an enhancement type field effect transistor, said 2n operational amplifiers are constructed by serially connecting them to n stages in a manner such that two operational amplifiers whose positive phase (+) sides and negative phase (−) sides are complementarily connected in parallel are used as one set, both outputs of one set of operational amplifiers constructing the set at the final stage of said n-stage connection are inputted to one (2n+1)th operational amplifier for the purpose of comparing them, and a comparison result is inputted as an output of said comparing circuit to said first integrating circuit.

8. An apparatus according to claim 3, wherein the input side signal of said inverting amplifier at the final stage of said amplifying circuit is voltage divided into a certain ratio $\{a/(a+b)\}$, its voltage division value is inputted to said second integrating circuit, the output side signal of said inverting amplifier at the final stage of said amplifying circuit is voltage divided into a ratio $\{b/(a+b)\}$ obtained by subtracting said ratio from 1, and its voltage division value is inputted to said third integrating circuit.

* * * * *